United States Patent [19]

Stoltz et al.

[11] Patent Number: 5,407,860

[45] Date of Patent: Apr. 18, 1995

[54] METHOD OF FORMING AIR GAP DIELECTRIC SPACES BETWEEN SEMICONDUCTOR LEADS

[75] Inventors: Richard A. Stoltz, Plano; Howard Tigelaar, Allen; Chih-Chen Cho, Richardson, all of Tex.

[73] Assignee: Texas Instruments Incorporated, Dallas, Tex.

[21] Appl. No.: 250,064

[22] Filed: May 27, 1994

[51] Int. Cl.⁶ ............................................. H01L 21/44
[52] U.S. Cl. ..................... 437/180; 437/195; 437/65; 437/228; 437/194; 437/231
[58] Field of Search ............... 437/180, 192, 194, 195, 437/65, 228, 231

[56] References Cited

U.S. PATENT DOCUMENTS

| | | | |
|---|---|---|---|
| 4,987,101 | 1/1991 | Kaanta et al. | 437/228 |
| 5,001,079 | 3/1991 | Van Laarhoven et al. | 437/194 |
| 5,017,509 | 5/1991 | Tuckerman | 437/195 |
| 5,192,715 | 3/1993 | Sliwa, Jr. et al. | 437/195 |
| 5,310,700 | 5/1994 | Lien et al. | 437/195 |

FOREIGN PATENT DOCUMENTS

| | | | |
|---|---|---|---|
| 0098134 | 4/1988 | Japan | 437/65 |
| 0318752 | 12/1988 | Japan | 437/194 |
| 0151032 | 6/1990 | Japan | 437/195 |
| 0240947 | 9/1990 | Japan | 437/195 |

Primary Examiner—Brian E. Hearn
Assistant Examiner—Tuan Nguyen
Attorney, Agent, or Firm—Ruben C. DeLeon; James C. Kesterson; Richard L. Donaldson

[57] ABSTRACT

This is a device and method of forming air gaps in between metal leads comprising. The method comprising: forming the metal leads 51–53 on an insulating layer 50; depositing a nonwetting material layer 56 on the metal leads 51–53 and the insulating layer 50; anisotropically etching the nonwetting material 56 to remove the nonwetting material 56 from open areas and leaving the nonwetting material on side walls of the metal leads 51–53; and depositing a dielectric layer 60 on top of the metal leads 51–53, and the insulating layer 50, whereby the air gaps 58 are produced in between the metal leads 51–53 below the dielectric layer 60. The method may include anisotropically etching at an angle, not vertical, whereby the etching allows removal of the nonwetting material from exterior side walls of the metal leads. The method may also include leaving the nonwetting material layer in between the metal leads. The deposition of the dielectric layer may utilize plasma deposition and spin on techniques.

7 Claims, 1 Drawing Sheet

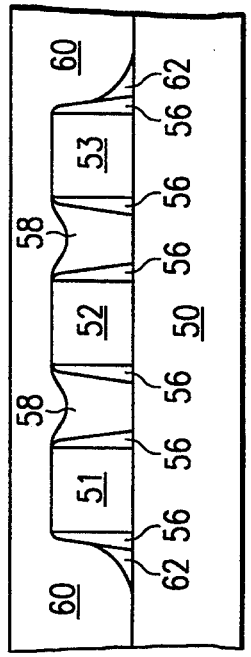
FIG. 4
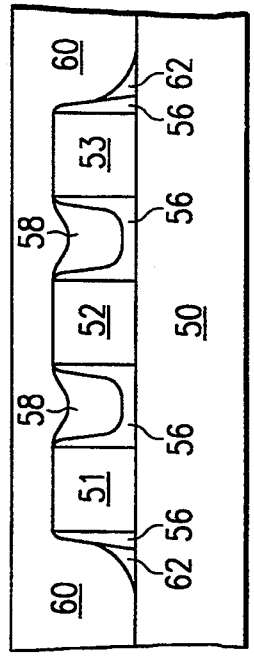
FIG. 5
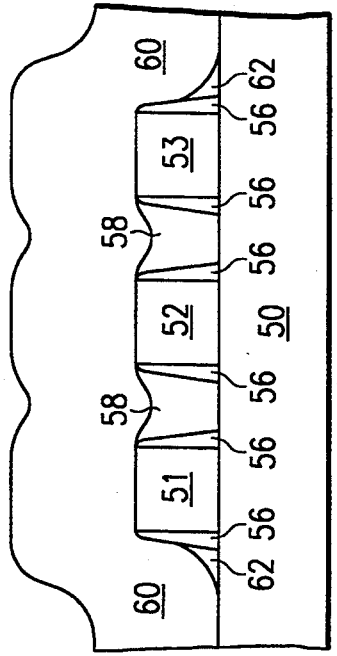
FIG. 6
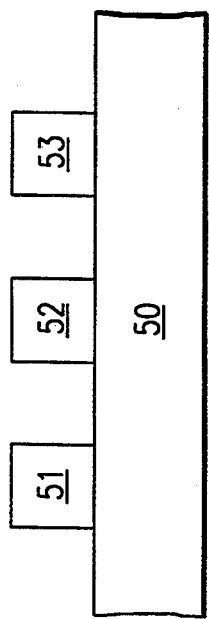
FIG. 1
FIG. 2
FIG. 3
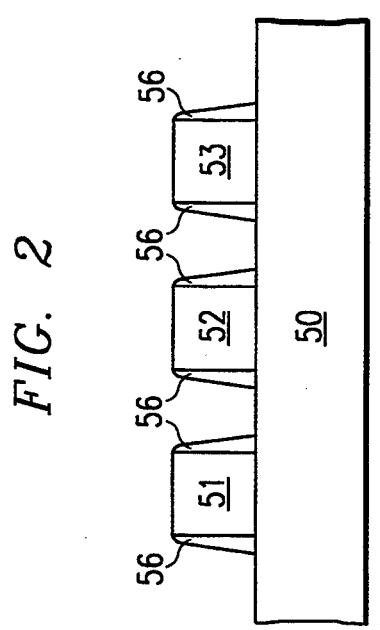

METHOD OF FORMING AIR GAP DIELECTRIC SPACES BETWEEN SEMICONDUCTOR LEADS

CROSS-REFERENCE TO RELATED APPLICATIONS

The following coassigned patent applications are hereby incorporated herein by reference:

| Serial No. | Filing Date | TI Case No. |
| --- | --- | --- |
| 08/148,773 | 11/05/93 | TI-18256 |
| 08/148,779 | 11/05/93 | TI-18521 |

FIELD OF THE INVENTION

This invention is directed towards the field of fabrication of electronic components, and in particular, to the use of fluorosurfactant agents in; air gap dielectric materials.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections. A single semiconductor microchip ;may have thousands, and even millions of transistors. Logically, a single microchip may also have millions of fines interconnecting the transistors.

While semiconductor devices are being scaled in the horizontal dimension to reduce wafer cost by getting more chips per wafer or to increase circuit complexity by getting more transistors per chip, they are not necessarily being scaled in the vertical dimensions. One of the reasons for this is that as metals are scaled in the horizontal dimension, the current density of the leads increases. If the metal leads were also scaled in the vertical dimension, the current density would exceed reliability limits. With horizontal scaling, these tall metal leads are being packed closer and closer together causing capacitive coupling between the leads to become the primary limitation to circuit speed.

The material typically used to isolate metal lines from each other is silicon dioxide. Silicon dioxide is a thermally and chemically stable material. Conventional oxide etches are also available for high-aspect-ratio contacts and vias. However, the dielectric constant of dense silicon oxide grown by thermal oxidation or chemical vapor deposition is on the order of 3.9. The dielectric constant is based on a scale where 1.0 represents the dielectric constant of a vacuum. Various materials exhibit dielectric constants from very near 1.0 to values in the hundreds. As used herein, the term low dielectric will refer to a material with a dielectric constant less than 3.3.

SUMMARY OF THE INVENTION

Recently, attempts have been made to use low-density materials having a lower dielectric constant to replace dense silicon oxide. One of the low-k methods being proposed is to form air gaps between the intermetallic leads. While oxide has a dielectric constant of about 4, the dielectric constant of air is about 1.

The present invention discloses a method to improve the formation of the air gaps between closely spaced leads. When depositing the interlevel dielectric that isolates two separate layers of interconnect, it is desirable for the dielectric to adhere strongly to the top horizontal surface and to be discouraged from depositing into the gaps between narrowly spaced metal lines.

The present invention utilizes a layer of low dielectric material which forms a nonwetting surface within the gaps. One example of such a material is a copolymer made from tetraflouroethylene and 2,2-bis(trifluoromethyl)-4,5-difluoro-1,3-dioxole (TFE AF). (TFE AF is commercially available from "DU PONT" in a product known as amorphous "TEFLON"; "TEFLON" is a polymer made from polytetrafluoroethylene (PTFE) also commercially available from "DU PONT"). The low dielectric layer is then etched back to remove it from the open fields and leaving it on the side walls of the metal leads and in one embodiment, on the bottom of narrow lead-to-lead gaps. When the next dielectric layer is deposited, the nonwetting low dielectric material will discourage the new dielectric layer from depositing in between the closely spaced metal leads and thus encourage the formation of air gaps in these areas.

One advantage of the present invention is the air gaps in between the metal leads have a low dielectric constant and thus reduce the capacitance in these areas.

In addition, the nonwetting material's low dielectric constant also contributes to the reduction in capacitance in these areas.

This is a device and method of forming air gaps in between metal leads comprising: forming the metal leads on an insulating layer; depositing a thin nonwetting material layer on the metal leads and the insulating layer; anisotropically etching the nonwetting material to remove the nonwetting material layer from open areas and leaving the nonwetting material in the gaps of closely spaced metal leads; and depositing a dielectric layer on top of the metal leads, and the insulating layer, whereby the air gaps are produced in between the metal leads below the dielectric layer. The method may include anisotropically etching at an angle from vertical, whereby the etching allows removal of the nonwetting material from exterior side walls of the metal leads. The etching may be done anisotropically at an angle from vertical, of at least 10 degrees (and preferably between 30 and 50 degrees). The method may also include leaving the nonwetting material layer in between the closely spaced metal leads. The deposition of the dielectric layer may utilize plasma deposition and spin on techniques.

BRIEF DESCRIPTION OF THE DRAWINGS

The foregoing and further aspects of the invention are illustrated in the accompanying drawings wherein like elements are denoted by like reference designators and in which:

FIGS. 1–5 are vertical cross sectional views of sequential steps in the fabrication of an interconnect structure according to the preferred embodiment of the invention; and FIG. 6 is a vertical cross sectional view of an interconnect structure according to an alternate embodiment of the invention.

DETAILED DESCRIPTION OF THE PREFERRED EMBODIMENTS

In one embodiment, and as shown in FIG. 1, metals (e.g. aluminum) leads 51–53 are formed by conventional processes on top of an insulating layer 50 (e.g. silicon dioxide).

Then, a layer of dielectric material 56, which forms a nonwetting surface within the gaps, is deposited over the insulating layer 50 and metal leads 51-53 as shown in FIG. 2. One example of such a material is TFE AF. The deposition of TFE AF is described in cross-referenced patent application 08/148,773 and 08/148,779.

The layer of dielectric material 56 is then etched back using an anisotropic etch to remove it from the horizontal surfaces and leave it on the vertical surfaces of the side walls of the metal leads as shown in FIG. 3.

As shown in FIG. 4, the next dielectric layer 60 (e.g. spin-on glass) is deposited on top of the metal leads 51-53 and insulating layer 50. The nonwetting dielectric material 56 discourages deposition of the next dielectric layer 60 in the gaps between the metal leads and aids the formation of air gaps 58 in these areas (as used herein, the term "air gap" is to include gaps with other, especially inert gases, and also gaps with at least partial vacuums). In addition, since the nonwetting dielectric material 56 was etched away from the top of the metal leads and away from the open fields, these areas are mechanically bonded to the next dielectric layer 60. Generally a small gap 62 will also be produced on the outside metal leads 51-53. The dielectric layer 60 may then be planarized, along with any other subsequent processing required to complete the semiconductor wafer.

FIG. 6 shows an alternate embodiment whereas an anisotropic etch at an angle from vertical, was utilized to completely etch nonwetting material from the open fields, but leave the nonwetting material along the side walls of the metal leads, as well as the bottoms of the gaps. The additional nonwetting material at the bottom of the gaps could increase the promotion of air gaps in the areas between the metal leads, or allow at least partial filling of the region between metal leads with wet dielectric precursors and the shrinkage of dielectric 60 during drying to produce gaps 58. The anisotropic etch may be performed by a directional etching source positioned at an angle from vertical. Preferrably, the wafer would be rotated during the etching process. Various directional etching techniques are well known in the art and could very easily be adapted for the this embodiment.

Alternatively, a masking layer could be utilized to etch the nonwetting material from the open fields and thus remove the material from the side walls adjacent to those open fields.

While this invention has been described with reference to illustrative embodiments, this description is not intended to be constructed in a limiting sense. Various modifications and combinations of the illustrative embodiments, as well as other embodiments of the inventions, will be apparent to persons skilled in the art upon reference to the description. It is therefore intended that the appended claims encompass any such modifications or embodiments.

What is claimed is:

1. A method of forming air gaps in between metal leads comprising:
   a. forming said metal leads on an insulating layer;
   b. depositing a nonwetting material layer on said metal leads and said insulating layer;
   c. anisotropically etching said nonwetting material to remove said nonwetting material layer from open areas and leaving said nonwetting material on side walls of said metal leads; and
   d. depositing a dielectric layer on top of said metal leads, and said insulating layer, whereby said air gaps are produced in between said metal leads below said dielectric layer.

2. The method of claim 1, wherein said anisotropically etching further includes anisotropically etching at an angle, not vertical, whereby said etching allows removal of said nonwetting material from exterior side walls of said metal leads.

3. The method of claim 2, wherein said depositing said nonwetting material layer deposits said nonwetting material layer in between said metal leads and said etching does not remove said nonwetting material layer from in between said metal leads.

4. The method of claim 1, wherein said etching utilizes a anisotropic etch.

5. The method of claim 1, wherein said depositing said dielectric layer utilizes plasma deposition techniques.

6. The method of claim 1, wherein said dielectric layer utilizes spin on techniques.

7. The method of claim 1, wherein said anisotropically etching of nonwetting material layer is at an angle of at least 10 degrees from vertical.

* * * * *